(12) United States Patent
Tajiri et al.

(10) Patent No.: US 6,956,280 B2
(45) Date of Patent: Oct. 18, 2005

(54) INTEGRATED CIRCUIT APPARATUS AND NEURO ELEMENT

(75) Inventors: Masayuki Tajiri, Tenri (JP); Nobuyoshi Awaya, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 56 days.

(21) Appl. No.: 10/397,090

(22) Filed: Mar. 25, 2003

(65) Prior Publication Data

US 2003/0183878 A1 Oct. 2, 2003

(30) Foreign Application Priority Data

Mar. 27, 2002 (JP) ........................................ 2002-089796

(51) Int. Cl.$^7$ .............................................. H01L 29/00
(52) U.S. Cl. ...................................... 257/537; 257/536
(58) Field of Search ................................. 257/536, 537

(56) References Cited

U.S. PATENT DOCUMENTS

| | | | | |
|---|---|---|---|---|
| 4,618,985 A | * | 10/1986 | Pfeiffer ........................ | 704/261 |
| 5,296,835 A | * | 3/1994 | Nakamura ................... | 338/130 |
| 5,517,139 A | * | 5/1996 | Chung et al. ................. | 327/94 |
| 6,204,139 B1 | | 3/2001 | Liu et al. | |
| 6,282,448 B1 | * | 8/2001 | Katz et al. .................... | 607/48 |
| 6,473,332 B1 | * | 10/2002 | Ignatiev et al. ............. | 365/148 |

FOREIGN PATENT DOCUMENTS

JP             06021531 A             1/1994

* cited by examiner

*Primary Examiner*—Ngân V. Ngô
(74) *Attorney, Agent, or Firm*—Morrison & Foerster LLP

(57) ABSTRACT

Input signals are weighted by weighting means composed of variable resistors, each made of an oxide thin film with a perovskite structure containing manganese, which changes resistance at room temperature according to the cumulative number of times a pulse voltage was applied and holds the resistance in a nonvolatile manner. Then, the weighted signals are inputted to an arithmetic unit. The oxide thin film used as each of the variable resistors changes its resistance, according to the cumulative number of times the input pulse was applied, and further holds the resistance in a nonvolatile manner even after the power supply is cut off. Thus, by changing the weighting factor according to the cumulative number of times the pulse voltage was applied, a neuro element more resembling a neuron of the human being is realized.

24 Claims, 12 Drawing Sheets

(TH : THRESHOLD VOLTAGE OF AMPLIFIER)

INTEGRATED CIRCUIT APPARATUS AND NEURO ELEMENT

BACKGROUND OF THE INVENTION

1. Field of the Invention

The present invention relates to a neuro element that models a neuron of the human being, which assigns weights individually to input signals inputted from a plurality of input terminals, inputs the respective weighted input signals to an arithmetic unit and performs an operation, and, when the result of the operation exceeds a predetermined value, fires and outputs a predetermined output signal. The present invention also relates to an integrated circuit apparatus for realizing such a neuro element.

2. Description of Related Art

A neuro element is a device that models a neuron, which forms a tissue such as the brain and eyes of the human being, by means of an electronic circuit. More specifically, by replacing one cell body, one axon and a plurality of dendrites and synapses of a neuron with equivalent electronic parts or electronic circuits, the neuro element is realized.

FIG. 1 is a schematic view for explaining the concept of the neuro element. A plurality of input signals with voltages $V_1$ through $V_n$, inputted from a plurality of input terminals $I_1$ through $I_n$, are weighted by weighting factors $W_1$ through $W_n$, respectively, and the neuro element performs an operation on these weighted input signals, for example, the operation of addition as follows.

$$\theta = \sum V_i W_i$$
$$= V_1 W_1 + V_2 W_2 + V_3 W_3 + \ldots V_n W_n$$

Then, when the value of $\theta$ that is the result of this operation exceeds a predetermined threshold value TH, an output signal with a predetermined voltage $V_{out}$ is outputted, and this signal becomes an input signal to the neuro element in the next stage.

FIG. 2 is a circuit diagram of a conventional ordinary neuro element. In this example, by substituting a plurality of fixed resistors 13-1 through 13-n for the synapses, an arithmetic circuit 12 for the cell body, and wires or the like for the dendrites and axons, a neuron of a human being is modeled as a whole. Input signals (whose voltages are $V_1$ through $V_n$) from a plurality of input terminals $I_1$ through $I_n$ are weighted by resistances $R_1$ through $R_n$ of the respective fixed resistors 13-1 through 13-n. Accordingly, the input voltages $V_1$ through $V_n$ are converted into currents with magnitudes $V_1/R_1, V_2/R_2, V_3/R_3, \ldots, V_n/R_n$ and arithmetically summed together, and then inputted into the arithmetic circuit 12 composed of, for example, a comparator, etc. Then, when the sum of the input currents to the arithmetic circuit 12 exceeds a predetermined threshold value, an output signal with a predetermined voltage $V_{out}$ is outputted from the arithmetic circuit 12 and supplied as an input signal to the neuro element in the next stage. Note that, regarding the specific structure of the arithmetic circuit 12, it is possible to use various circuits other than the circuit configuration shown in FIG. 2.

By the way, a plurality of the neuro elements as mentioned above are combined together and used for fields, such as character recognition and voice recognition, where general digital computers are weak. However, in the case of realizing a neuro element modeling a characteristic of the neuron of the human being, that is, the function of gradually speeding the reaction, i.e., making the reaction more sensitive, by receiving the same stimulation repeatedly many times, for example, it is necessary to change the weighting factor stepwise, according to the accumulated number of times of inputting (applying) the input signal corresponding to a stimulation received by the human being, and holds the weighting factor changed stepwise in a nonvolatile manner.

As a neuro element capable of changing the weighting factor stepwise and holding the weighting factor changed stepwise in a nonvolatile manner, there is a known invention which is disclosed in Japanese Patent Application Laid-Open No. 6-21531 (1994), and constructs a resistor functioning as the weighting means shown in FIG. 2 with a variable resistor using a chalcogen compound.

However, in the neuro element of the above-mentioned invention disclosed in Japanese Patent Application Laid-Open No. 6-21531 (1994), although the weighting factor can be changed according to the magnitude of a pulse voltage applied to the chalcogen compound used as the weighting means (variable resistor), it is impossible to change the weighting factor according to the number of times the pulse voltage was applied.

The reason for this is that the change in the resistance of the chalcogen compound uses a phase transition between a crystalline state and an amorphous state due to Joule heat generated by the current, and therefore the amplitude of the applied pulse voltage is reflected on the occupancy ratio between the crystal region and amorphous region to be formed, and then stored. However, the information about the previous input pulse voltage (the occupancy ratio between the crystal region and the amorphous region formed by the previous input pulse voltage), which was stored just before this moment in the weighting means made of the chalcogen compound, is overwritten by the information about the newly applied pulse voltage. In other words, the information stored in the weighting means made of the chalcogen compound corresponds only to the latest applied pulse voltage.

Hence, in the neuro element of the above-mentioned invention disclosed in Japanese Patent Application Laid-Open No. 6-21531 (1994), there is no change between the resistance of the chalcogen compound after application of one input signal and the resistance after application of the same input voltage again. In order to simplify the explanation, let consider the neuro element with one input. For example, suppose that, with the application of a pulse voltage having the amplitude of 3 V, the occupancy ratio between the crystal region and the amorphous region of the chalcogen compound was brought into a state produced by the application of the pulse voltage with the amplitude of 3 V, and the resistance changed from 100 kΩ to 10 kΩ. Thereafter, when the same pulse voltage with the amplitude of 3 V is applied again, the occupancy ratio between the crystal region and the amorphous region of the chalcogen compound can be brought only into the state obtained by the application of the pulse voltage with the amplitude of 3 V. Consequently, even when the application of the pulse voltage with the amplitude of 3 V is repeated many times, the resistance of the chalcogen compound does not change and remains 10 kΩ.

Hence, in the neuro element of the above-mentioned invention disclosed in Japanese Patent Application Laid-Open No. 6-21531 (1994), when the same input signal is inputted repeatedly, the resistance of the chalcogen compound functioning as the weighting means does not change. Therefore, in order to fire the neuro element, it is necessary to apply a pulse voltage with larger amplitude sufficient to fire the neuro element. Thus, this conventional neuro element will never fire by continuing the application of the same input signal. For the above-mentioned reasons, the neuro element of the invention disclosed in Japanese Patent Application Laid-Open No. 6-21531 (1994) is not able to model the function of the neuron of the human being which reacts more sensitively by receiving the same stimulation repeatedly many times.

Additionally, FIG. 22 of Japanese Patent Application Laid-Open No. 6-21531 (1994) mentioned above illustrates a neuro element comprising a plurality of transistors and weighting means using, for example, SRAM cells, capacitors and floating gates, connected to the gates of the transistors. However, such a neuro element suffers from a problem of an increase in the area occupied by the weighting means on the circuit.

BRIEF SUMMARY OF THE INVENTION

The present invention has been made with the aim of solving the above problems, and it is an object of the present invention to provide a neuro element capable of changing the weighting factor, according to the cumulative number of times an input signal was applied, and holding the weighting factor in a nonvolatile manner so as to model a characteristic of a neuron of the human being, for example, that is, the function of gradually reacting faster, in other words, more sensitively, by receiving the same stimulation repeatedly many times.

Moreover, in order to realize such a neuro element, it is an object of the present invention to provide an integrated circuit apparatus comprising a variable resistor that changes its resistance, according to the cumulative number of times an input signal was applied, and holds the resistance in a nonvolatile manner.

A further object of the present invention is to provide a neuro element comprising weighting means whose area on a circuit is made as small as possible.

Furthermore, in order to realize such a neuro element, it is an object of the present invention to provide an integrated circuit apparatus comprising a variable resistor that changes its resistance, according to the cumulative number of times an input signal was applied, and holds the resistance in a nonvolatile manner.

An integrated circuit apparatus of the present invention is characterized by comprising: a variable resistor made of a material that changes its resistance, according to the cumulative number of times a pulse voltage was applied, and holds the resistance in a nonvolatile manner; and arithmetic means for performing an arithmetic operation, based on an input signal converted by the variable resistor, and outputting a predetermined output signal if the result of the operation exceeds a predetermined value.

Besides, a neuro element of the present invention is characterized by comprising: weighting means composed of a variable resistor made of a material that changes a weighting factor, according to the cumulative number of times a pulse voltage was applied, and holds the weighting factor in a nonvolatile manner; and arithmetic means for performing an arithmetic operation, based on an input signal weighted by the weighting means, and outputting a predetermined output signal by firing when the result of the operation exceeds a predetermined value.

In such an integrated circuit apparatus and neuro element of the present invention, the variable resistor (weighting means) changes the resistance (weighting factor), according to the cumulative number of times a pulse voltage was applied, and holds the resistance (weighting factor) in a nonvolatile manner. Thus, the arithmetic means performs an arithmetic operation, based on the input signal converted by each of the variable resistors (weighting means) and outputs a predetermined output signal when the result of the operation exceeds a predetermined value, while each variable resistor (weighting means) stores its resistance even after the power supply is cut off.

Moreover, the integrated circuit apparatus and neuro element of the present invention are characterized in that the material is an oxide with a perovskite structure containing at least manganese.

In such an integrated circuit apparatus and neuro element of the present invention, the variable resistor (weighting means) made of an oxide with a perovskite structure containing at least manganese changes the resistance (weighting factor), according to the cumulative number of times a pulse voltage was applied, and stores the resistance in a nonvolatile manner.

Further, the integrated circuit apparatus and neuro element of the present invention are characterized in that the oxide with the perovskite structure is any one of the materials indicated as $Pr_{(1-x)}Ca_xMnO_3$, $La_{(1-x)}Ca_xMnO_3$, or $La_{(1-x-y)}Ca_xPb_yMnO_3$ (where x<1, y<1, x+y<1).

In such an integrated circuit apparatus and neuro element of the present invention, the variable resistor (weighting means) made of an oxide whose analyzed value is either $Pr_{(1-x)}Ca_xMnO_3$, $La_{(1-x)}Ca_xMnO_3$, or $La_{(1-x-y)}Ca_xPb_yMnO_3$ (where x<1, y<1, x+y<1) changes the resistance (weighting factor), according to the cumulative number of times a pulse voltage was applied, and stores the resistance in a nonvolatile manner.

In addition, the integrated circuit apparatus and neuro element of the present invention are characterized in that the oxide with the perovskite structure is any one of the materials indicated as $Pr_{0.7}Ca_{0.3}MnO_3$, $La_{0.65}Ca_{0.35}MnO_3$, or $La_{0.65}Ca_{0.175}Pb_{0.175}MnO_3$.

In such an integrated circuit apparatus and neuro element of the present invention, the variable resistor (weighting means) made of any one of the materials indicated as $Pr_{0.7}Ca_{0.3}MnO_3$, $La_{0.65}Ca_{0.35}MnO_3$, or $La_{0.65}Ca_{0.175}Pb_{0.175}MnO_3$ changes the resistance (weighting factor), according to the cumulative number of times a pulse voltage was applied, and stores the resistance in a nonvolatile manner.

Moreover, the integrated circuit apparatus of the present invention is characterized in that the variable resistor is connected in series between one or each of a plurality of input terminals and the arithmetic means.

Besides, the neuro element of the present invention is characterized in that the weighting means is connected in series between one or each of a plurality of input terminals and the arithmetic means.

In such an integrated circuit apparatus and neuro element of the present invention, the variable resistor is connected in series between one or each of a plurality of input terminals and the arithmetic means. Therefore, when a negative pulse voltage is applied to each of the variable resistors (weighting means) first and a pulse voltage with a polarity same as the first input pulse is further applied thereafter so as to increase the resistance (weighting factor) in advance, then, when a positive input pulse voltage is applied repeatedly, the resistance of the variable resistor (weighting means) decreases gradually according to the cumulative number of times the positive input pulse voltage is applied, and consequently the value of the weighting factor that is the inverse number of the resistance of each variable resistor increases.

Furthermore, the integrated circuit apparatus of the present invention is characterized in that the variable resistor is connected in series between one or each of a plurality of input terminals and a ground potential, and characterized by further comprising a fixed resistor connected in series between the one or each of a plurality of input terminals and the arithmetic means.

In addition, the neuro element of the present invention is characterized in that the weighting means is connected in series between one or each of a plurality of input terminals and a ground potential, and characterized by further comprising a fixed resistor connected in series between the one or each of a plurality of input terminals and the arithmetic means.

In such an integrated circuit apparatus and neuro element of the present invention, the variable resistor is connected in series between one or each of a plurality of input terminals and a ground potential, and there is further provided a fixed resistor which is connected in series between the one or each of a plurality of input terminals and the arithmetic means. Hence, with an increase in the resistance of each variable resistor, the flow of the input current from each input terminal to each fixed resistor increases, and consequently the current flowing into the arithmetic means of the neuro element also increases.

Moreover, the integrated circuit apparatus of the present invention is characterized in that the variable resistor increases its resistance when a pulse voltage with a polarity same as a pulse voltage inputted in an initial state is applied, while decreases the resistance when a pulse voltage with a polarity opposite to the pulse voltage inputted in the initial state is applied.

Furthermore, the neuro element of the present invention is characterized in that the weighting means changes the weighting factor in one direction when a pulse voltage with a polarity same as a pulse voltage inputted in an initial state is applied, while changes the weighting factor in opposite direction when a pulse voltage with a polarity opposite to the pulse voltage inputted in the initial state is applied.

In such an integrated circuit apparatus and neuro element, the variable resistor increases its resistance when a pulse voltage with a polarity same as the pulse voltage inputted in the initial state is applied, while decreases the resistance when a pulse voltage with a polarity opposite to the pulse voltage inputted in the initial state is applied.

The above and further objects and features of the invention will more fully be apparent from the following detailed description with accompanying drawings.

DETAILED DESCRIPTION OF THE PREFERRED EMBODIMENTS

The following description will explain the present invention in detail, based on the drawings illustrating some embodiments thereof.

Note that, as weighting means of a neuro element, i.e., a variable resistor of an integrated circuit apparatus of the present invention, the present invention uses a variable resistor composed of an oxide with a perovskite structure containing manganese, such as, a $Pr_{0.7}Ca_{0.3}MnO_3$ thin film (hereinafter referred to as the "PCMO film"), for example, which has resistance that changes with application of pulse voltage at room temperature and a nonvolatile characteristic, i.e., the characteristic of holding the resistance at the time the power supply is cut off even when the power supply is cut off, as disclosed in the U.S. Pat. No. 6,204,139 B1.

The perovskite structure is a crystal structure which was first analyzed by Perovskite ($CaTiO_3$), and means a simple cubic structure as an ideal lattice.

Figure 3:
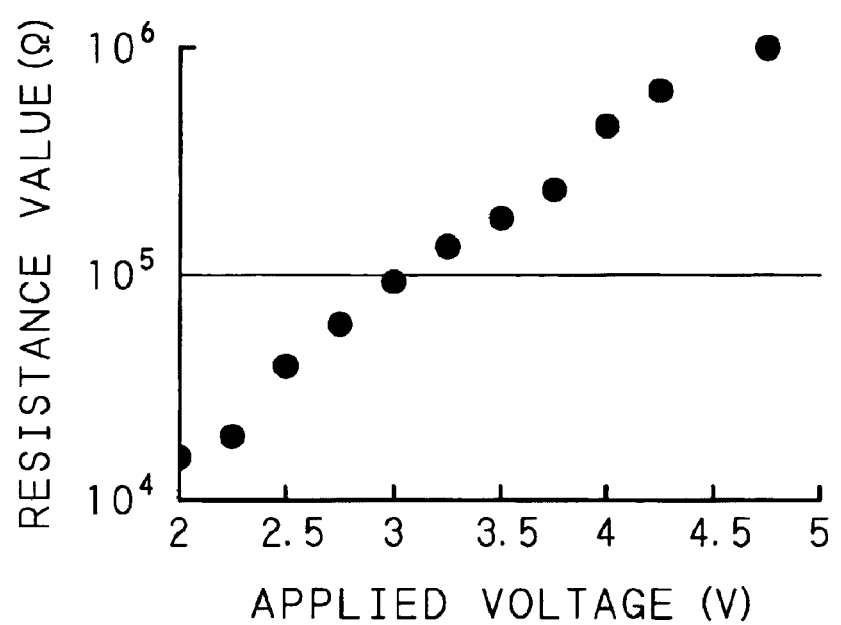
FIG. 3 is a graph showing the change in the resistance caused by application of pulse voltage to an oxide thin film (PCMO film) used in the present invention.

FIG. 3 is a graph showing the change in the resistance of an oxide thin film (PCMO film) used in the present invention, which was caused by application of pulse voltage. This graph shows that, when a pulse voltage is applied to the PCMO thin film as described above, first, the resistance increases exponentially according only to the amplitude of the pulse voltage, irrespective of the polarity of the pulse voltage. In this case, since the change in the resistance is smooth, it is possible to realize fine changes in the weighting. Whereas, although not shown in FIG. 3, when a pulse voltage with opposite polarity to the first applied pulse voltage is applied, the resistance of the PCMO thin film decreases.

Figure 4A:
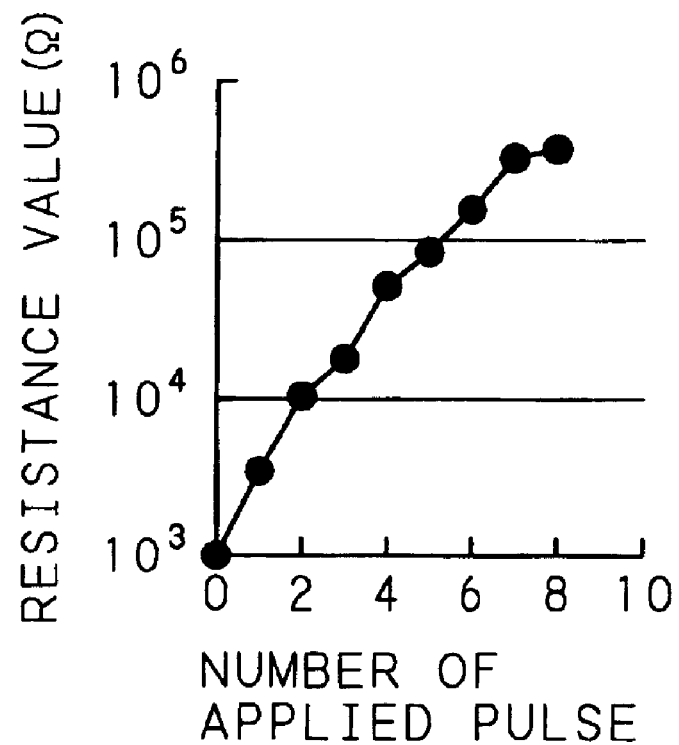
FIG. 4A is a graph showing the change in the resistance caused by application of a positive short-time pulse voltage to the oxide thin film (PCMO film) used in the present invention.
Figure 4B:
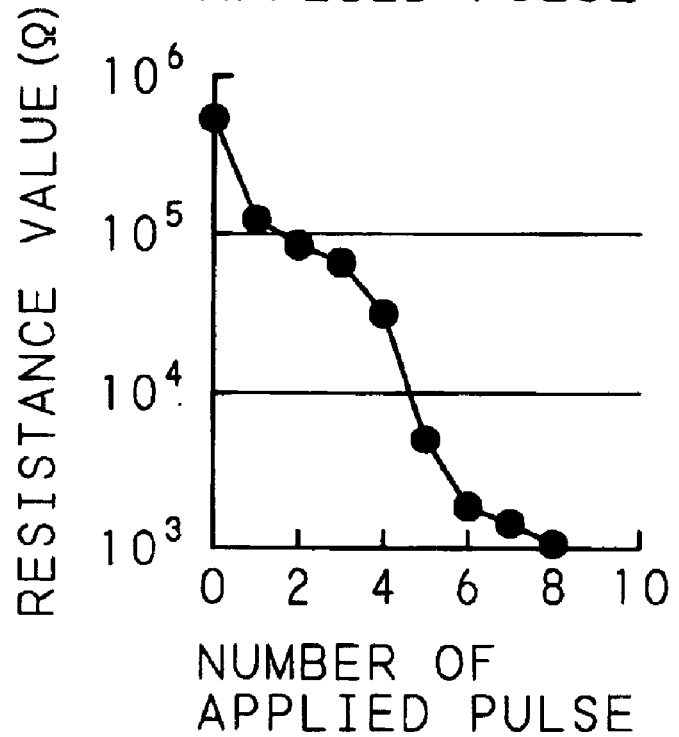
FIG. 4B is a graph showing the change in the resistance caused by application of a negative short-time pulse voltage to the oxide thin film (PCMO film) used in the present invention.

FIG. 4A and FIG. 4B are graphs showing the changes in the resistance of the oxide thin film (PCMO film) used in the present invention, which was caused by application of short-time pulse voltage, and FIG. 4A indicates the change in the resistance when positive pulses were applied, while FIG. 4B indicates the change in the resistance when negative pulses were applied.

More specifically, the PCMO film as described above exhibits changes in the resistance as shown in the graphs of FIG. 4A and FIG. 4B with respect to a pulse voltage having a short pulse width ($10^{-9}$ second order). It can be understood from the characteristic shown in the graph of FIG. 3 that the resistance increases according to the amplitude of the pulse voltage, whereas, in the graph of FIG. 4A, the resistance increases according to the cumulative number of times a pulse voltage (+3 through +5 V) with a polarity (positive polarity) same as the first applied pulse voltage was applied.

Further, when a pulse voltage (−3 through −5 V) with a polarity (negative polarity) opposite to the first applied pulse voltage is applied, as shown in the graph of FIG. 4B, the resistance of the PCMO thin film decreases according to the cumulative number of times the pulse voltage was applied. By using a variable resistor, which utilizes the change in the resistance according to the cumulative number of times the pulse voltage was applied, as the weighting means, it becomes possible to realize the function of a neuron of the human being of responding more rapidly by receiving the same stimulation repeatedly, in other words, responding more sensitively by learning.

In addition to the above-described characteristics, with a nonvolatile characteristic inherent to a thin film of oxide with a perovskite structure containing manganese, such as the above-mentioned PCMO, the resistance is held even after the power supply is cut off, i.e., the weighting factor of the weighting means is stored even after the power supply is cut off. Besides, as will be described later, since individual weighting means is able to be realized by one variable resistor made of a thin film of oxide as described above, or the one variable resistor and one fixed resistor, it is possible to achieve a reduction in the area occupied by the individual weighting means, thereby enabling a significant reduction in the entire area of the neuro element.

Figure 5:
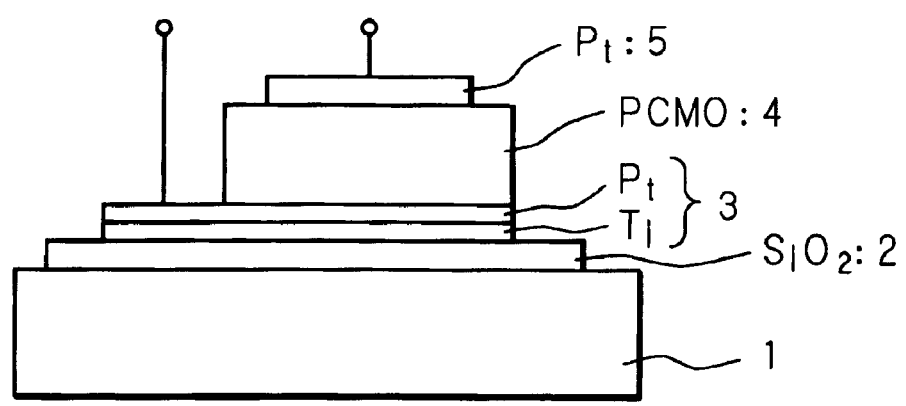
FIG. 5 is a schematic view showing one example of the structure of a nonvolatile variable resistor composed of an oxide thin film (PCMO film) of an integrated circuit apparatus of the present invention.

FIG. 5 is a schematic view showing one example of the structure of a nonvolatile variable resistor composed of a thin film of oxide as described above. A method for manufacturing the nonvolatile variable resistor shown in FIG. 5 is as follows.

First, an insulating film 2 made of a $SiO_2$ film or a $LaAlO_3$ film that is a mono-crystalline insulator is deposited on a silicon wafer 1. A lower electrode 3 whose material is Pt, Ir, Ti, or conductive oxide $YBaCu_3O_7$ is deposited on this insulating film 2. Further, on this lower electrode 3, a manganese oxide film 4 made of any one of the materials whose analyzed value is indicated as $Pr_{(1-x)}Ca_xMnO_3$, $La_{(1-x)}Ca_xMnO_3$, or $La_{(1-x-y)}Ca_xPb_yMnO_3$ (where x<1, y<1, x+y<1), for example, $Pr_{0.7}Ca_{0.3}MnO_3$, $La_{0.65}Ca_{0.35}MnO_3$, and $La_{0.65}Ca_{0.175}Pb_{0.175}MnO_3$, is deposited by a MOCVD method, spin coating method, laser ablation, sputtering method, etc. In addition, Pt is vapor-deposited as an upper electrode 5 on this manganese oxide film 4. For the contact with a wire, Au, Ag, Pt or a conductive oxide such as $IrO_2$ is used.

Note that, in the example shown in FIG. 5, a $SiO_2$ film is used as the insulating film 2, Pt with Ti as the base is used as the lower electrode 3, PCMO ($Pr_{0.7}Ca_{0.3}MnO_3$) is used as the manganese oxide film 4, and Pt is used as the upper electrode 5. Further, the size of the nonvolatile variable resistor shown in FIG. 5 is a circle with a diameter of about 200 $\mu$m and a thickness of about 3000 Å, and thus the area occupied by this resistor on the circuit is extremely small.

Figure 6:
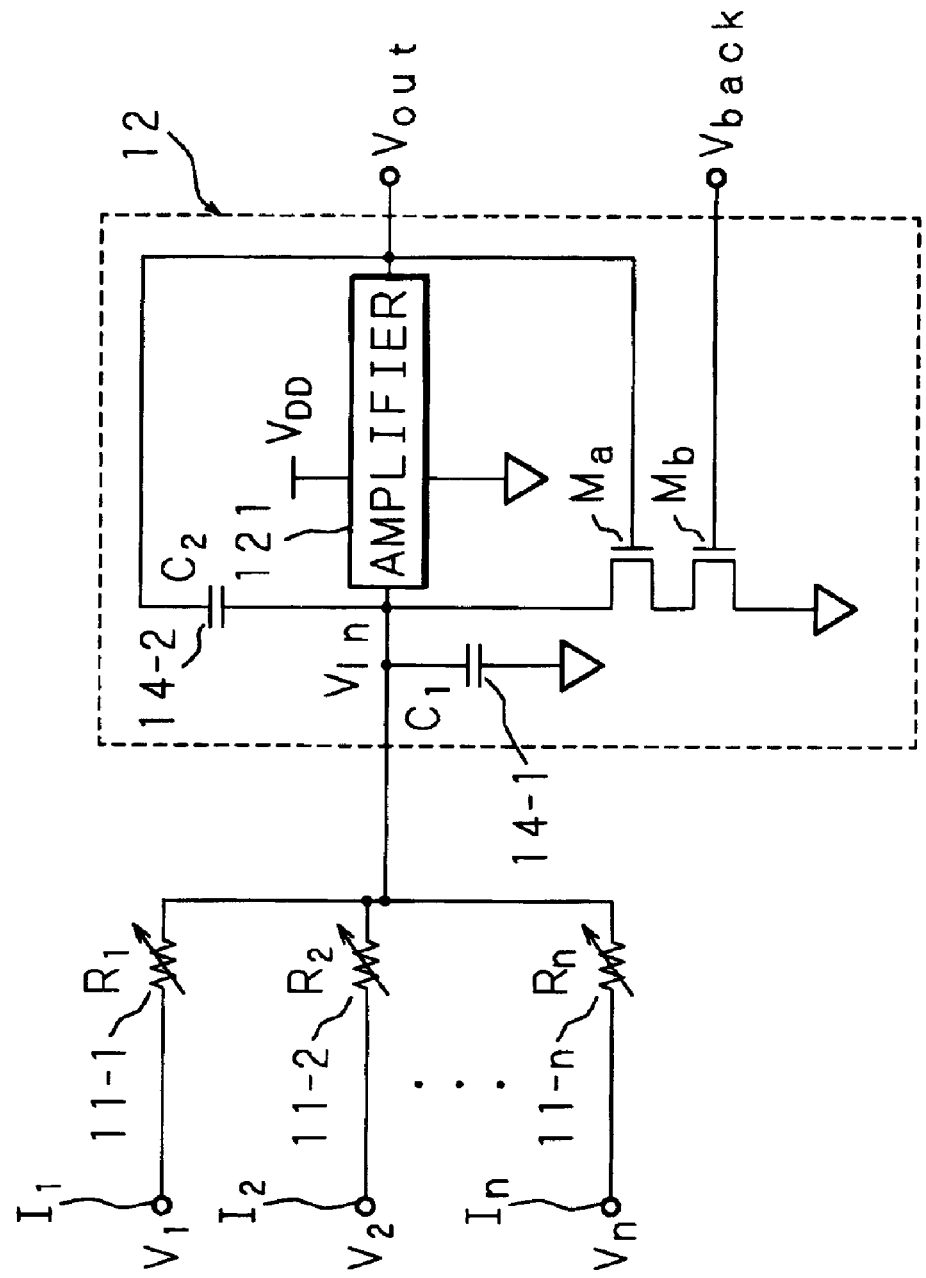
FIG. 6 is a circuit diagram showing one example of the basic structure of the circuit configuration of the integrated circuit apparatus, i.e., a neuro element of the present invention.

Next, the following description will explain the circuit configuration of the integrated circuit apparatus, i.e., the neuro element of the present invention, with reference to the circuit diagram of FIG. 6 showing one example of the basic structure thereof.

Nonvolatile variable resistors 11-1 through 11-n (having resistances $R_1$ through $R_n$, respectively) are formed to have a structure that uses, as the manganese oxide film 4 shown in FIG. 5, a thin film of a material which shows a change in the resistance with application of pulse voltage at room temperature, i.e., an oxide with a perovskite structure containing manganese, such as $Pr_{0.7}Ca_{0.3}MnO_3$ (PCMO), for example, disclosed in the U.S. Pat. No. 6,204,139 B1. With the use of such nonvolatile variable resistors 11-1 through 11-n, it is possible to change the resistances $R_1$ through $R_n$, according to the cumulative number of times the pulse voltage was applied.

In FIG. 6, a section indicated with the reference number 12, enclosed by the broken line, is an arithmetic unit which corresponds to the cell body of a neuron. For the circuit of this arithmetic unit, for example, the one described in the document "Analog VLSI and Neural Systems" (written by Carver Mead) is adopted. More specifically, the circuit of this arithmetic unit 12 comprises a capacitive dividing circuit including two capacitors 14-1 and 14-2; an amplifier 121; and a reset circuit including two transistors Ma and Mb, and realizes the function of generating a neural pulse by the axon hillock in the neuron and then returning to the original state by an electronic circuit. The outputs of other neuro elements (in the previous stage) are supplied as input signals to the arithmetic unit 12 from the input terminals $I_1$ through $I_n$, (the voltage values of the input signals are $V_1$ through $V_n$, respectively) through the nonvolatile variable resistors 11-1 through 11-n. These input signals correspond to the synapses and the axons of other neurons.

In the neuro element of the present invention shown in FIG. 6, first, a negative pulse voltage is applied to each of the nonvolatile variable resistors 11-1 through 11-n functioning as the weighting means beforehand, and then a pulse voltage having the same polarity as the first input pulse is further applied so as to increase the resistance in advance. In the following input process, positive input voltages $V_1$ through $V_n$ are applied to the nonvolatile variable resistors 11-1 through 11-n, respectively, from the input terminals $I_1$ through $I_n$, and then the currents are arithmetically summed through the nonvolatile variable resistors 11-1 through 11-n and flow into the arithmetic unit 12. The sum I of the currents at this time is expressed by a following equation.

$$I = \sum V_i / R_i$$
$$= V_1/R_1 + V_2/R_2 + V_3/R_3 + \ldots + V_n/R_n$$

Figure 1:
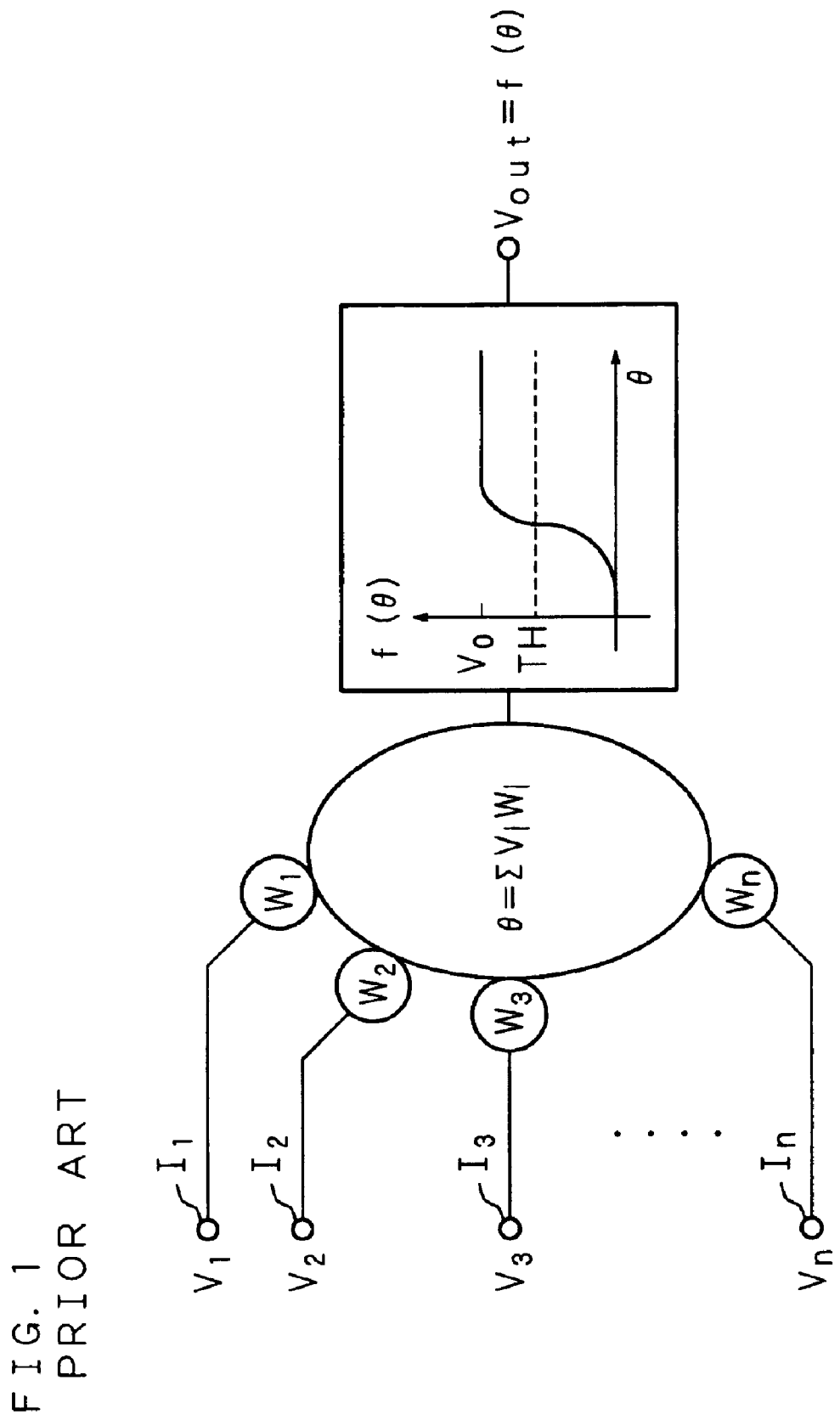
FIG. 1 is a schematic view for explaining the concept of a neuro element.
Figure 2:
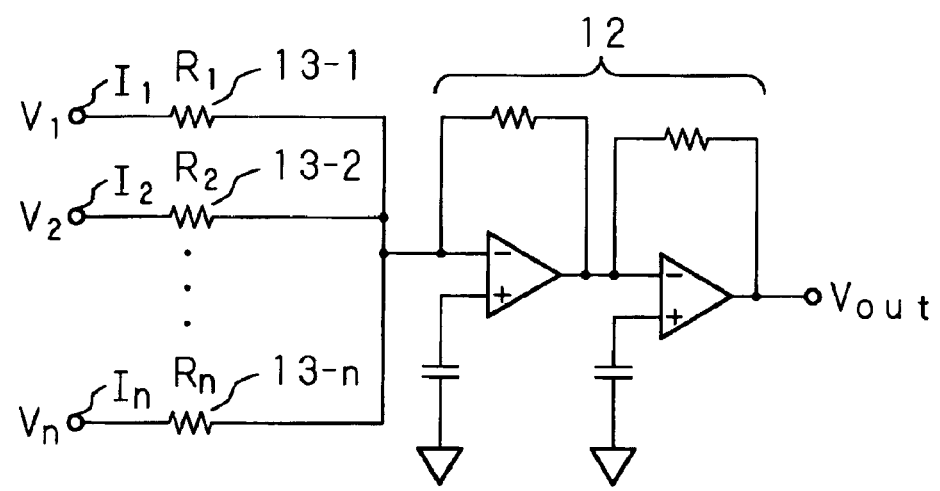
FIG. 2 is a circuit diagram of a conventional ordinary neuro element.

In this example, however, by applying the positive input pulse voltage repeatedly, the resistances $R_1$ through $R_n$ of the nonvolatile variable resistors 11-1 through 11-n decrease stepwise according to the cumulative number of times of the application, and therefore the values of the weighting factors $W_1$ through $W_n$ which are the inverse numbers of the resistances $R_1$ through $R_n$ of the nonvolatile variable resistors 11-1 through 11-n increase. Note that the physical quantity θ shown in FIG. 1 is associated with the current I, and the weighting factors $W_1$ through $W_n$ are associated with $1/R_1$ through $1/R_n$, and thus the circuit shown in FIG. 6 is substantially equivalent to the circuit shown in FIG. 1 as an example of the prior art.

By the way, PCMO constituting each of the nonvolatile variable resistors 11-1 through 11-n has such a characteristic that, when a pulse voltage is first applied, the resistance increases irrespective of the polarity of the pulse voltage, and thereafter, when a pulse voltage with the same polarity as this initial input pulse is applied, the resistance increases, but, when a pulse voltage with the opposite polarity is applied, the resistance decreases. Furthermore, there is a characteristic that the nonvolatile variable resistors 11-1 through 11-n are more easily controlled when increasing their resistance than when decreasing their resistance. Thus, from the viewpoint of making the control easier with an increase in the number of the nonvolatile variable resistors 11-1 through 11-n, when a circuit design for increasing the input current by increasing the weighting factor of the weighting means is adopted, it is possible to realize a neuro element which is very easy to use.

Figure 7:
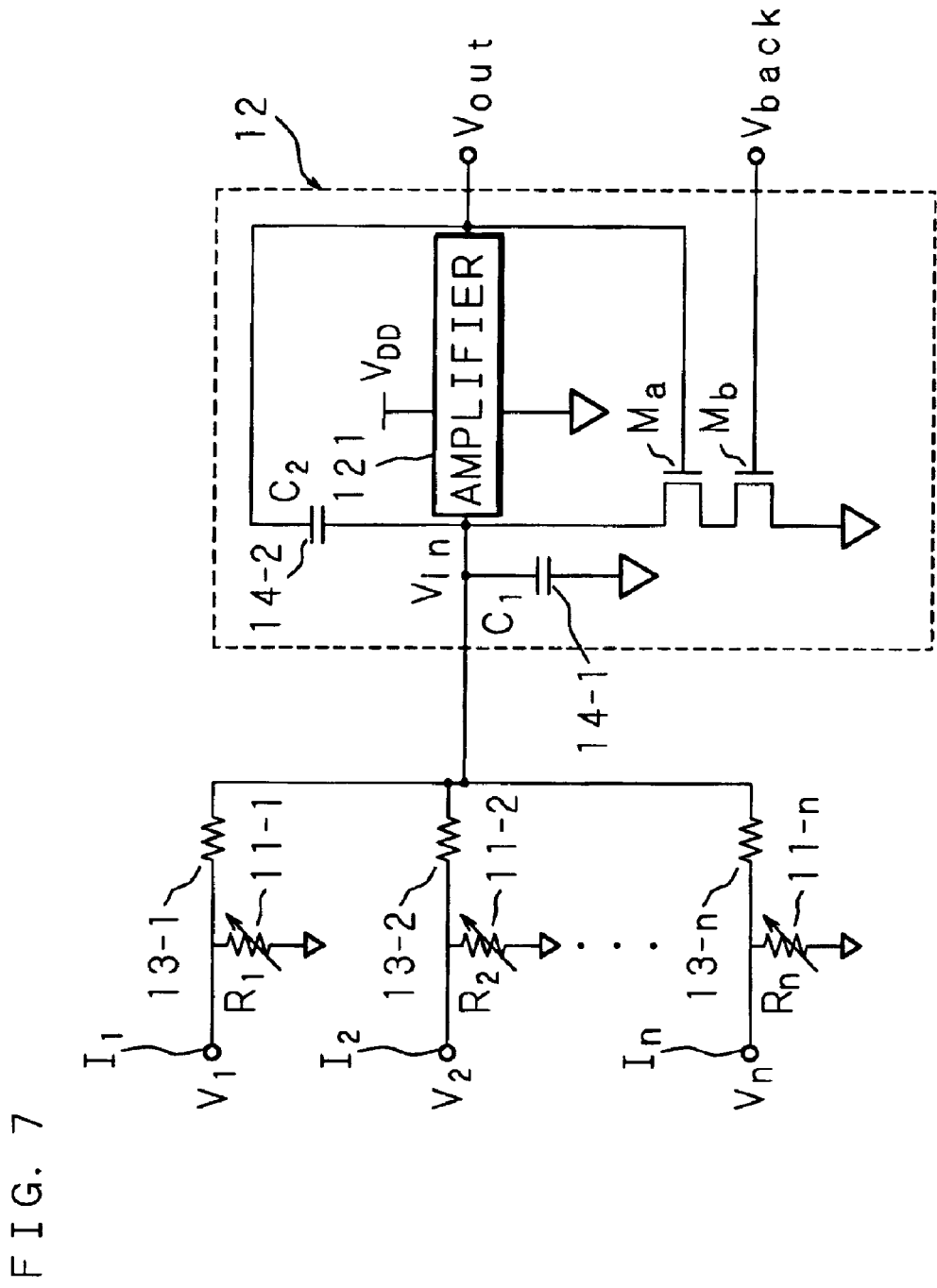
FIG. 7 is a circuit diagram showing another example of the basic structure of the circuit configuration of the integrated circuit apparatus, i.e., the neuro element of the present invention.

For such reasons, as shown in the circuit diagram of FIG. 7, it is effective to connect the nonvolatile variable resistors 11-1 through 11-n in series between the respective input terminals $I_1$ through $I_n$ and the ground potential and also connect fixed resistors 13-1 through 13-n in series between the respective input terminals $I_1$ through $I_n$ and the arithmetic unit 12, and thereby inputting the input pulse voltage into the arithmetic unit 12 through fixed resistors 13-1 through 13-n. With an increase in the resistances $R_1$ through $R_n$ of the nonvolatile variable resistors 11-1 through 11-n, the flow of the input currents from the input terminals $I_1$ through $I_n$ to the fixed resistors 13-1 through 13-n increases, and consequently the current flowing into the arithmetic unit 12 of the neuro element also increases.

For the above-mentioned reasons, in the neuro element shown in FIG. 7, it is not necessary to increase the resistance of each of the nonvolatile variable resistors 11-1 through 11-n in advance as in the neuro element shown in FIG. 6, and there is an advantage that the resistance of each of the fixed resistors 13-1 through 13-n can be set in advance according to the purpose of using the neuro element.

The operation principle of the arithmetic unit 12 of each of the neuro elements shown in FIG. 6 and FIG. 7 is as follows. Note that the arithmetic unit 12 comprises a capacitor 14-1 (with capacitance $C_1$) having one end connected in common to the output terminal of each of the nonvolatile variable resistors 11-1 through 11-n, or the output terminal of each of the fixed resistors 13-1 through 13-n, and the other end connected to the ground potential; an amplifier 121 whose input terminal is connected to one terminal of the capacitor 14-1; a capacitor 14-2 (with capacitor $C_2$) having one end connected to the output terminal of the amplifier 121 and the other end connected to the input terminal of the amplifier 121 so as to form a feedback loop; and transistors Ma and Mb connected in series between the input terminal of the amplifier 121 and the ground potential. Besides, the output terminal of the amplifier 121 is connected to the gate of the transistor Ma, and an output $V_{back}$ of the neuro element connected to the next stage is connected to the gate of the transistor Mb.

When the input current to the arithmetic unit 12 flows into the capacitor 14-1 and charge accumulates, then an electric potential $V_{in}$ of one terminal of the capacitor 14-1 (the input terminal of the amplifier 121) increases. During a period in which $V_{in}$ is relatively low, the gain of the amplifier 121 is not more than 1, and therefore the positive feedback through the capacitor 14-2 can hardly function, and the increase in $V_{in}$ is relatively moderate. However, when $V_{in}$ increases to a certain value, the gain of the amplifier 121 increases abruptly, and consequently an amount $C_2/(C_1+C_2)$ times the amount of the increase in the electric potential $V_{out}$ of the output terminal of the amplifier 121 is fed back to the input terminal of the amplifier 121 by the positive feedback through the capacitor 14-2. Accordingly, the output signal of the amplifier 121, i.e., the voltage $V_{out}$ of the output signal of the arithmetic unit 12, increases abruptly to a power supply voltage $V_{DD}$. This corresponds to firing of a neuron.

In an actual neuron, the positive feedback at the axon hillock is achieved by a sodium channel which depends on the voltage. When the electric potential inside the cell body increases, the sodium channel is open and the sodium current increases, thereby making the cytoplasm more positive toward the reverse electric potential (55 mV) of sodium. In other words, the positive feedback through the capacitor 14-2 performs the function of positive feedback through the sodium channel in the neuron. On the other hand, the capacitor 14-1 functions as the cell membrane.

In the reset circuit, when both of the electric potential $V_{out}$ of the output terminal of the amplifier 121 and the output potential $V_{back}$ of the neuro element connected to the next stage have become sufficiently high, the transistors Ma and Mb having them as the inputs to the gates thereof are both turned on, and then the charge stored in the capacitor 14-1 flows to the ground potential, thereby resetting the arithmetic unit 12. Accordingly, the output of each neuro element is stabilized, and each neuro element is reset after this output fires the neuro element of the next stage.

The above-described reset operation of the neuro element is similar to the function of the potassium channel in the neuron. Although the number of potassium channels is larger than that of sodium channels, the potassium channels have poor reaction for changing the cytoplasm potential and increase the number of open channels gradually after the neuron was completely depolarized by the function of the sodium channels, while the open sodium channels decrease due to the inactivity inherent to the channels. When the open potassium channels become more than the open sodium channels, the cytoplasm is made more negative toward the reverse potential (−92 mV) of potassium. When the cell body is polarized again, the open sodium channels decrease rapidly, the sodium current is also reduced, and the cytoplasm potential is further decreased. Finally, the potassium channels are closed, and the cell body returns to a state of being able to fire again.

In an actual circuit, since there is leakage in the capacitor 14-1, when input signals from other neuro elements, i.e., input signals to the respective input terminals $I_1$ through $I_n$ are cut, then the charge in the capacitor 14-1 will all leak out finally. Therefore, although the above-described reset circuit is not essential, but, if there is a need to fire the neuro element continuously before the charge in the capacitor 14-1 all leaks out, it is necessary to prepare for forceful leakage of the charge in the capacitor 14-1.

Figure 8:
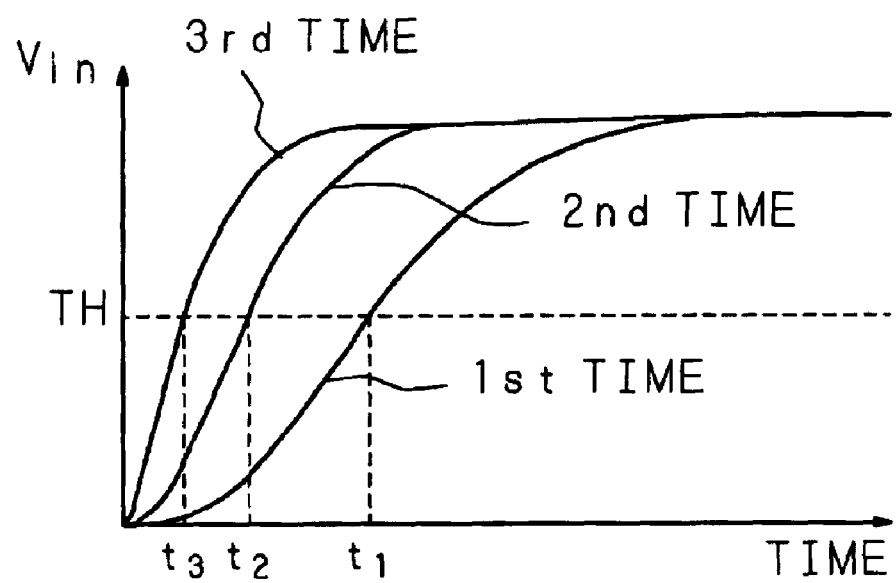
FIG. 8 is a graph showing schematically the time taken to fire the integrated circuit apparatus and neuro element of the present invention.

FIG. 8 is a graph showing schematically the time taken to fire the integrated circuit apparatus and neuro element of the present invention. More specifically, FIG. 8 is a graph showing the time taken to fire the neuro element of the present invention that uses an oxide with a perovskite structure containing manganese as mentioned above for the weighting means, i.e., the variable resistors, and illustrates how the resistance changes, in other words, the voltage ($V_{in}$) of the current flowing into the amplifier 121 of the arithmetic unit 12 changes, every time a series of pulse voltages is applied repeatedly to the variable resistors (weighting means) of the integrated circuit apparatus and neuro element of the present invention.

First, when a series of pulse voltages is applied repeatedly for the first time, the increase in the voltage $V_{in}$ is relatively moderate, and the voltage $V_{in}$ reaches the threshold voltage TH of the amplifier 121 and firing occurs at timing t1. Thereafter, when the arithmetic unit 12 is once reset and a series of pulse voltages is applied repeatedly for the second time, the increase in the voltage $V_{in}$ is slightly faster compared to the first time. The reason for this is that the resistance of each of the nonvolatile variable resistors 11-1 through 11-n was already changed by the first application of a series of pulse voltages and the resistance is held in a nonvolatile manner, and consequently charge accumulates in the capacitor 14-1 more rapidly compared to the first application. As a result, when a series of pulse voltages is applied repeatedly for the second time, the firing timing is t2 which is shorter than t1 of the first application. In addition, when a series of pulse voltages is applied repeatedly for the third time in the same manner as above, the firing timing is t3 which is shorter than t2.

Thus, the fact that the firing timing becomes faster gradually means that the neuro element of the present invention reacts more sensitively as the number of times of application of the same signal increases, which also means the realization of a neuro element more resembling a neuron of the human being.

Note that, in the case where a conventional variable resistor made of a chalcogen compound is used as the weighting means, even when the same input signal is applied repeatedly, the resistance of the variable resistor does not change, and therefore the firing timing is invariable. Moreover, with the weighting means using the conventional variable resistor made of a chalcogen compound, firing does not occur unless an input pulse voltage with a pulse width of at least the period of t3 is applied. Whereas, in the present invention, even when the input pulse voltage has a pulse width less than the period of t3, when it is applied repeatedly, firing occurs eventually. The reason for this is that the resistance of the variable resistor is gradually decreased by applying the pulse voltage repeatedly, and the input pulse certainly has a pulse width necessary for firing.

Figure 9:
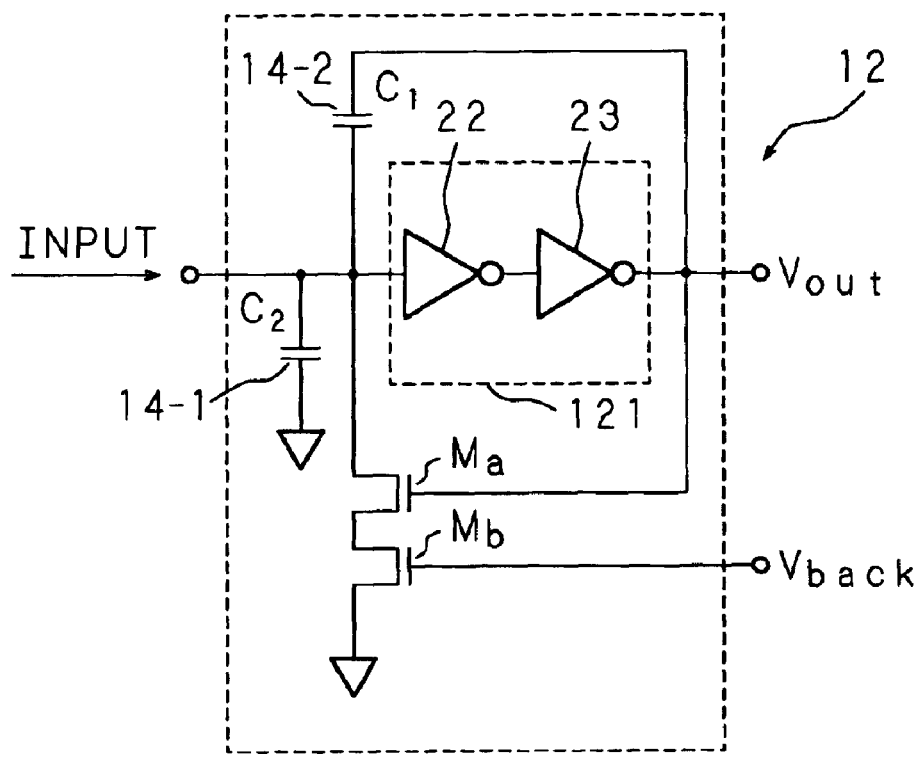
FIG. 9 is a circuit diagram showing an arithmetic unit of a neuro element representing one example of an embodiment of the present invention.

By the way, regarding the arithmetic unit 12, particularly, the amplifier 121, there is a variety of possible embodiments, and the simplest one is the structure in which two inverters 22 and 23 are connected in series as shown in the circuit diagram of FIG. 9. However, when resetting is performed by activating the reset circuit composed of the transistors Ma and Mb while the input signal still exists, there is a possibility that the output is oscillated. In the actual neuron, this problem is not so serious because the actual neuron does not operate with a clock as fast as that in the electronic circuit, and therefore there is often sufficient time for decay of the inputs to the synapses. However, in a neuro element which is implemented by a semiconductor and operates at high speed, the problem of oscillation of the output signal needs to be taken into sufficient consideration.

In order to prevent such an oscillation of the output signal in the neuro element, it is possible to take some measures, such as connecting the output of a neuro element in a sufficiently later stage, instead of the neuro element in the next stage, as the input $V_{back}$ to the gate of the transistor Mb of the reset circuit; sufficiently improving the drive performance of the transistors of the reset circuit; and connecting a pass transistor to the output terminal of each neuro element to clock-control the input to the next stage.

Figure 10:
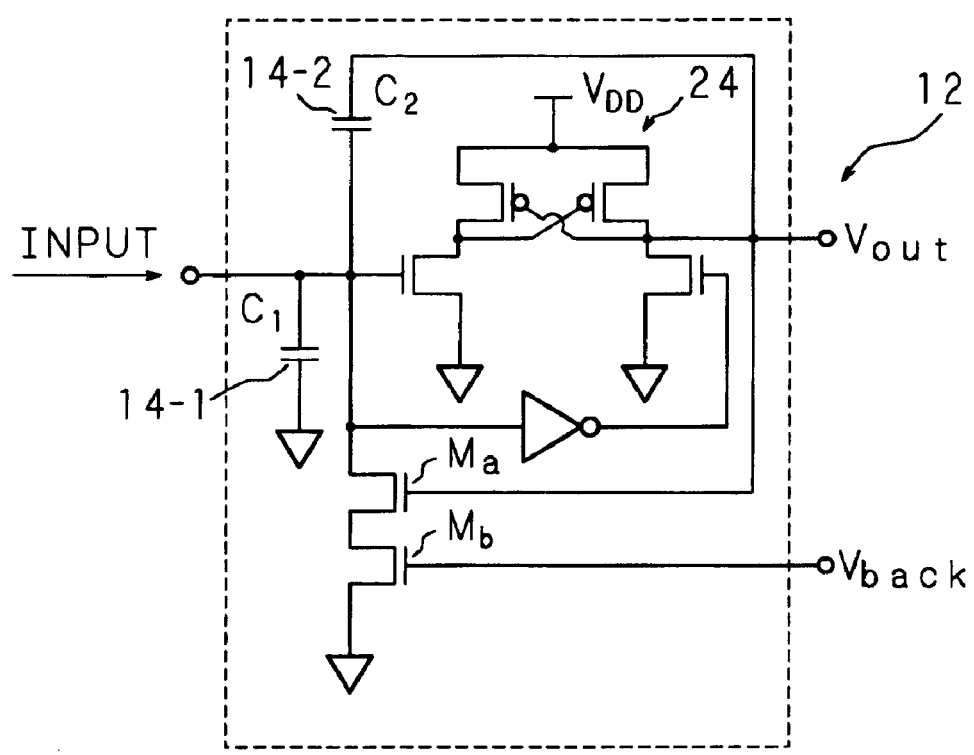
FIG. 10 is a circuit diagram showing an arithmetic unit of a neuro element representing one example of an embodiment of the present invention.

In another embodiment of the amplifier 121, a level shifter 24 as shown in the circuit diagram of FIG. 10 may be used. In the structure using the level shifter 24 shown in the circuit diagram of FIG. 10, when oscillation occurs, the oscillation frequency is relatively long compared to the structure including two inverters connected in series as shown in circuit diagram of FIG. 9. Therefore, even when oscillation occurs, if it occurs during a high speed operation, it is often the case that the input from the previous stage has decayed or the reset operation has been completed before reaching the peak of the oscillation, and thus there is a high possibility of preventing the circuit from running away. However, as shown in FIG. 10, since the number of the transistors of the level shifter 24 serving as the amplifier 121 increases to six, there is a possibility of canceling the reduction in the area occupied by the weighting means.

Figure 11:
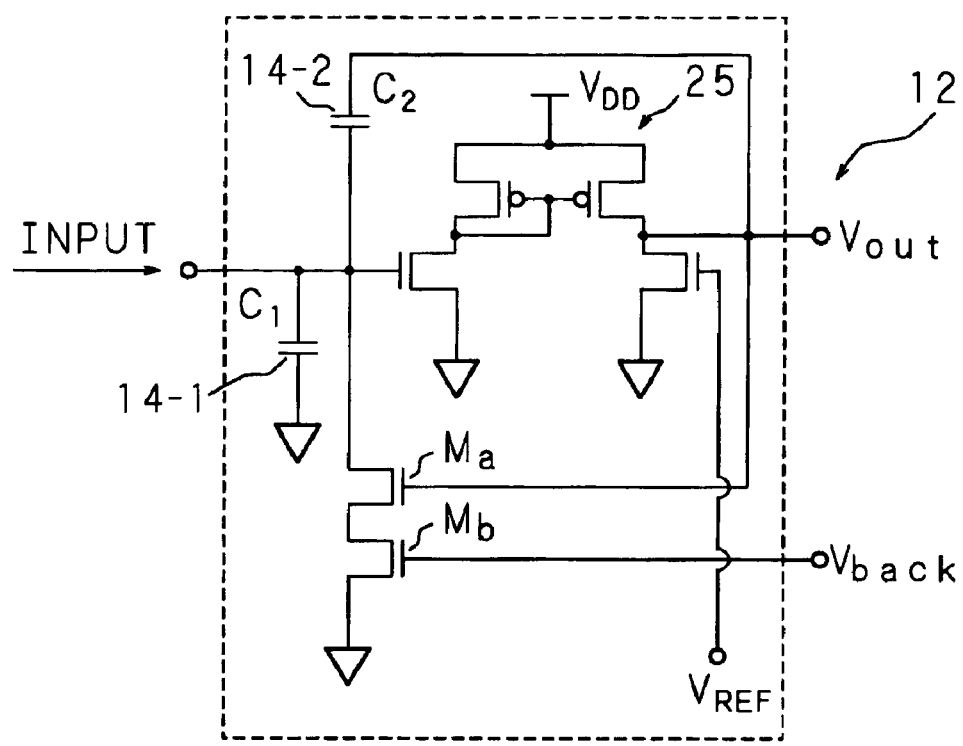
FIG. 11 is a circuit diagram showing an arithmetic unit of a neuro element representing one example of an embodiment of the present invention.

On the other hand, as shown in the circuit diagram of FIG. 11, when a differential amplifier 25 is used as the amplifier 121, it is possible to change the threshold value of the output of the neuro element by changing reference potential $V_{REF}$. In this case, when $V_{REF}$ is increased, the threshold value of the output of the neuro element also increases and the amount of current needed before the output is supplied increases, and therefore the neuro element itself goes to inactive direction.

Although it is not precisely equivalent, but, when the neuro element is seen from outside, the above-described function is very similar to the function of the chlorine channel in the neuron. Since the chlorine channel has the effect of increasing the conductance of the membrane without changing the cytoplasm potential, the influences of sodium and potassium on the cell membrane are reduced. As a result, the reaction of the neuron to the inputs from the synapses becomes poorer.

Figure 12:
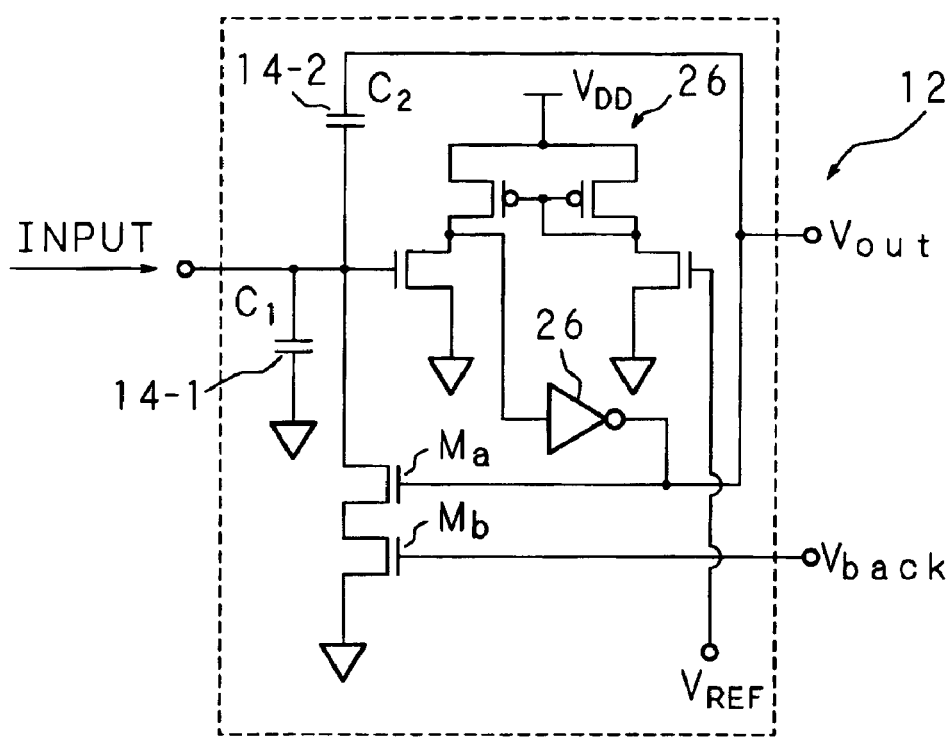
FIG. 12 is a circuit diagram showing an arithmetic unit of a neuro element representing one example of an embodiment of the present invention.

Since the differential amplifier shown in the circuit diagram of FIG. 11 often has insufficient amplification ability, the input/output characteristics may be improved by installing an inverter 26 as shown in the circuit diagram of FIG. 12.

As described in detail above, according to the integrated circuit apparatus and neuro element of the present invention, by forming a variable resistor using an oxide thin film which has a resistance changing according to the cumulative number of times a pulse voltage was applied at room temperature and holds the resistance in a nonvolatile manner, more specifically a thin film of an oxide with a perovskite structure containing manganese, it is possible to change the weight according to the amplitude of the pulse voltage as in the conventional neuro element, and also change the weight according to the cumulative number of times the pulse voltage was inputted in the past, thereby realizing the neuro element more resembling the neuron of the human being.

Moreover, as shown in the graph of FIG. 8, in the neuro element of the present invention, every time a series of pulse voltages is applied repeatedly, the voltage ($V_{in}$) of the current flowing into the arithmetic unit becomes higher more rapidly, and therefore the firing timing becomes faster gradually. The faster firing timing means that the neuro element reacts more sensitively as the number of times of application of the same signals increases, thereby realizing the neuro element more resembling the neuron of the human being.

Furthermore, according to the integrated circuit apparatus and neuro element of the present invention, by using a combination of fixed resistors and nonvolatile variable resistors for the weighting means, it is possible to utilize the characteristic of the nonvolatile variable resistors, that is, control is easier when increasing the resistance, and eliminate the necessity of increasing the resistance of the nonvolatile variable resistors in advance. Consequently, it becomes possible to set the resistance of the fixed resistors beforehand according to the purpose of using the neuro element circuit.

In addition, according to the integrated circuit apparatus and neuro element of the present invention, the area occupied by the weighting means on the circuit can be made very small.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. An integrated circuit apparatus for realizing a neuro element, comprising:
   a variable resistor made of a material that changes its resistance, according to cumulative number of times a pulse voltage was applied, and holds the resistance in a nonvolatile manner;
   arithmetic means for performing an arithmetic operation, based on an input signal converted by said variable resistor, and outputting a predetermined output signal when a result of the operation exceeds a predetermined value; and
   wherein said variable resist functions as weighing means of the neuro element, and output timing of said predetermined signal from said arithmetic means becomes faster by repeated application of the pulse voltage.

2. The integrated circuit apparatus as set forth in claim 1, wherein said material is an oxide with a perovskite structure containing at least manganese.

3. The integrated circuit apparatus as set forth in claim 2, wherein said oxide with the perovskite structure is any one of the materials indicated as $Pr_{(1-x)}Ca_xMnO_3$, $La_{(1-x)}Ca_xMnO_3$, or $La_{(1-x-y)}Ca_xPb_yMnO_3$ (where x<1, y<1, x+y<1).

4. The integrated circuit apparatus as set forth in claim 3, wherein said variable resistor is connected in series between one or each of a plurality of input terminals and said arithmetic means.

5. The integrated circuit apparatus as set forth in claim 4, wherein said variable resistor increases its resistance when a pulse voltage with a polarity same as a pulse voltage inputted in an initial state is applied, while decreases the resistance when a pulse voltage with a polarity opposite to the pulse voltage inputted in the initial state is applied.

6. The integrated circuit apparatus as set forth in claim 3,
   wherein said variable resistor is connected in series between one or each of a plurality of input terminals and a ground potential, and
   said integrated circuit apparatus further comprises a fixed resistor connected in series between said one or each of a plurality of input terminals and said arithmetic means.

7. The integrated circuit apparatus as set forth in claim 6, wherein said variable resistor increases its resistance when a pulse voltage with a polarity same as a pulse voltage inputted in an initial state is applied, while decreases the resistance when a pulse voltage with a polarity opposite to the pulse voltage inputted in the initial state is applied.

8. The integrated circuit apparatus as set forth in claim 2, wherein said oxide with the perovskite structure is any one of the materials indicated as $Pr_{0.7}Ca_{0.3}MnO_3$, $La_{0.65}Ca_{0.35}MnO_3$, or $La_{0.65}Ca_{0.175}Pb_{0.175}MnO_3$.

9. The integrated circuit apparatus as set forth in claim 8, wherein said variable resistor is connected in series between one or each of a plurality of input terminals and said arithmetic means.

10. The integrated circuit apparatus as set forth in claim 9, wherein said variable resistor increases its resistance when a pulse voltage with a polarity same as a pulse voltage inputted in an initial state is applied, while decreases the resistance when a pulse voltage with a polarity opposite to the pulse voltage inputted in the initial state is applied.

11. The integrated circuit apparatus as set forth in claim 8,
    wherein said variable resistor is connected in series between one or each of a plurality of input terminals and a ground potential, and
    said integrated circuit apparatus further comprises a fixed resistor connected in series between said one or each of a plurality of input terminals and said arithmetic means.

12. The integrated circuit apparatus as set forth in claim 11, wherein said variable resistor increases its resistance when a pulse voltage with a polarity same as a pulse voltage inputted in an initial state is applied, while decreases the resistance when a pulse voltage with a polarity opposite to the pulse voltage inputted in the initial state is applied.

13. A neuro element, comprising:
    weighting means composed of a variable resistor made of a material that changes a weighting factor, according to cumulative number of times a pulse voltage was applied, and holds the weighting factor in a nonvolatile manner;
    arithmetic means for performing an arithmetic operation, based on an input signal weighted by said weighting means, and outputting a predetermined output signal by firing when a result of the operation exceeds a predetermined value; and
    wherein firing timing of said arithmetic means becomes faster by repeated application of the pulse voltage to said weighting means.

14. The neuro element as set forth in claim 13, wherein said material is an oxide with a perovskite structure containing at least manganese.

15. The neuro element as set forth in claim 14, wherein said oxide with the perovskite structure is any one of the materials indicated as $Pr_{(1-x)}Ca_xMnO_3$, $La_{(1-x)}Ca_xMnO_3$, or $La_{(1-x-y)}Ca_xPb_yMnO_3$ (where x<1, y<1, x+y<1).

16. The neuro element as set forth in claim 15, wherein said weighting means is connected in series between one or each of a plurality of input terminals and said arithmetic means.

17. The neuro element as set forth in claim 16, wherein said weighting means changes the weighting factor in one direction when a pulse voltage with a polarity same as a pulse voltage inputted in an initial state is applied, while changes the weighting factor in opposite direction when a pulse voltage with a polarity opposite to the pulse voltage inputted in the initial state is applied.

18. The neuro element as set forth in claim 15,
    wherein said weighting means is connected in series between one or each of a plurality of input terminals and a ground potential, and
    said neuro element further comprises a fixed resistor connected in series between said one or each of a plurality of input terminals and said arithmetic means.

19. The neuro element as set forth in claim 18, wherein said weighting means changes the weighting factor in one direction when a pulse voltage with a polarity same as a pulse voltage inputted in an initial state is applied, while changes the weighting factor in opposite direction when a pulse voltage with a polarity opposite to the pulse voltage inputted in the initial state is applied.

20. The neuro element as set forth in claim 14, wherein said oxide with the perovskite structure is any one of the materials indicated as $Pr_{0.7}Ca_{0.3}MnO_3$, $La_{0.65}Ca_{0.35}MnO_3$, or $La_{0.65}Ca_{0.175}Pb_{0.175}MnO_3$.

21. The neuro element as set forth in claim 20, wherein said weighting means is connected in series between one or each of a plurality of input terminals and said arithmetic means.

22. The neuro element as set forth in claim 21, wherein said weighting means changes the weighting factor in one direction when a pulse voltage with a polarity same as a pulse voltage inputted in an initial state is applied, while changes the weighting factor in opposite direction when a pulse voltage with a polarity opposite to the pulse voltage inputted in the initial state is applied.

23. The neuro element as set forth in claim 20,
wherein said weighting means is connected in series between one or each of a plurality of input terminals and a ground potential, and
said neuro element further comprises a fixed resistor connected in series between said one or each of a plurality of input terminals and said arithmetic means.

24. The neuro element as set forth in claim 23, wherein said weighting means changes the weighting factor in one direction when a pulse voltage with a polarity same as a pulse voltage inputted in an initial state is applied, while changes the weighting factor in opposite direction when a pulse voltage with a polarity opposite to the pulse voltage inputted in the initial state is applied.

* * * * *